United States Patent
Dees et al.

(10) Patent No.: US 9,858,240 B2
(45) Date of Patent: Jan. 2, 2018

(54) AUTOMATIC CENTER FREQUENCY AND SPAN SETTING IN A TEST AND MEASUREMENT INSTRUMENT

(71) Applicant: Tektronix, Inc., Beaverton, OR (US)

(72) Inventors: Ian S. Dees, Aloha, OR (US); Thomas L. Kuntz, Portland, OR (US); David L. Suryan, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 703 days.

(21) Appl. No.: 13/713,084

(22) Filed: Dec. 13, 2012

(65) Prior Publication Data

US 2014/0172339 A1    Jun. 19, 2014

(51) Int. Cl.
*G06F 15/00* (2006.01)
*G01R 13/02* (2006.01)
*G01R 23/16* (2006.01)

(52) U.S. Cl.
CPC .......... *G06F 15/00* (2013.01); *G01R 13/029* (2013.01); *G01R 23/16* (2013.01)

(58) Field of Classification Search
CPC .......... G06F 15/00; G01R 23/16; G01R 13/20
See application file for complete search history.

(56) References Cited

U.S. PATENT DOCUMENTS

| | | | | |
|---|---|---|---|---|
| 4,321,680 A | * | 3/1982 | Bertrand et al. | 702/77 |
| 4,611,164 A | * | 9/1986 | Mitsuyoshi et al. | 324/76.19 |
| 4,839,582 A | * | 6/1989 | Fukaya et al. | 324/76.23 |
| 5,119,076 A | | 6/1992 | Wilson | |
| 5,706,202 A | * | 1/1998 | Itahara et al. | 702/77 |
| 6,445,327 B1 | * | 9/2002 | Kishi | 341/155 |
| 7,116,943 B2 | * | 10/2006 | Sugar | H04W 16/14 |
| | | | | 455/226.1 |

(Continued)

FOREIGN PATENT DOCUMENTS

| | | |
|---|---|---|
| EP | 0297590 A2 | 1/1989 |
| JP | 2002296310 A * | 10/2002 |

OTHER PUBLICATIONS

Anonymous, Bandpass Filter (BPF) and EQ Filter Relation between Q factor and bandwidth BW, Nov. 2011, http://www.sengpielaudio.com/calculator-bandwidth.htm.*

(Continued)

*Primary Examiner* — Alexander Satanovsky
*Assistant Examiner* — Lina Cordero
(74) *Attorney, Agent, or Firm* — Marger Johnson; Kevin Dothager

(57) ABSTRACT

A test and measurement instrument having initial display center frequency and span settings and configured to process an input signal is disclosed. The test and measurement instrument includes a processor configured to digitize the input signal and locate a primary peak and determine a primary peak center frequency of the input signal. The processor is configured to adjust the initial display center frequency setting based on the primary peak center frequency. The processor is configured to perform a bandwidth comparison by comparing a bandwidth of the primary peak at a peak bandwidth test level to a peak bandwidth threshold. The processor is configured adjust the initial span setting based on the bandwidth comparison and generate a processed waveform signal using the adjusted display center frequency and span settings.

19 Claims, 7 Drawing Sheets

(56) References Cited

U.S. PATENT DOCUMENTS 7,191,079 B2 3/2007 Smith et al.
2008/0082278 A1* 4/2008 Tan .................... G01R 13/0254
702/76

OTHER PUBLICATIONS

Anonymous: "Sprectrum Analyzers; 2399C 1 kHz to 3 GHz Sprectrum Analyzer; Aeroflex", Oct. 10, 2011, pp. 1-8, XP055108164, Retrieved from the Internet: URL: http://www.aeroflex.com/ats/products/prodfiles/datasheets/Aeroflex_2399C_Sprectrum_Analyzer_issue9.pdf, retrieved on Mar. 17, 2014.
Anonymous: "2399C Spectrum Analyzer Programming Manual", Jun. 13, 2007, pp. 1-220, XP055108154, Retrieved from the Internet: URL: http://www.aeroflex.com/ats/products/prodfiles/progmanuals/8821/2399C_Programming_Manual.pdf, retrieved on Mar. 17, 2014.
European Search Report and Written Opinion for Application No. 13194873.9 dated Mar. 17, 2014, 7 pages.

* cited by examiner

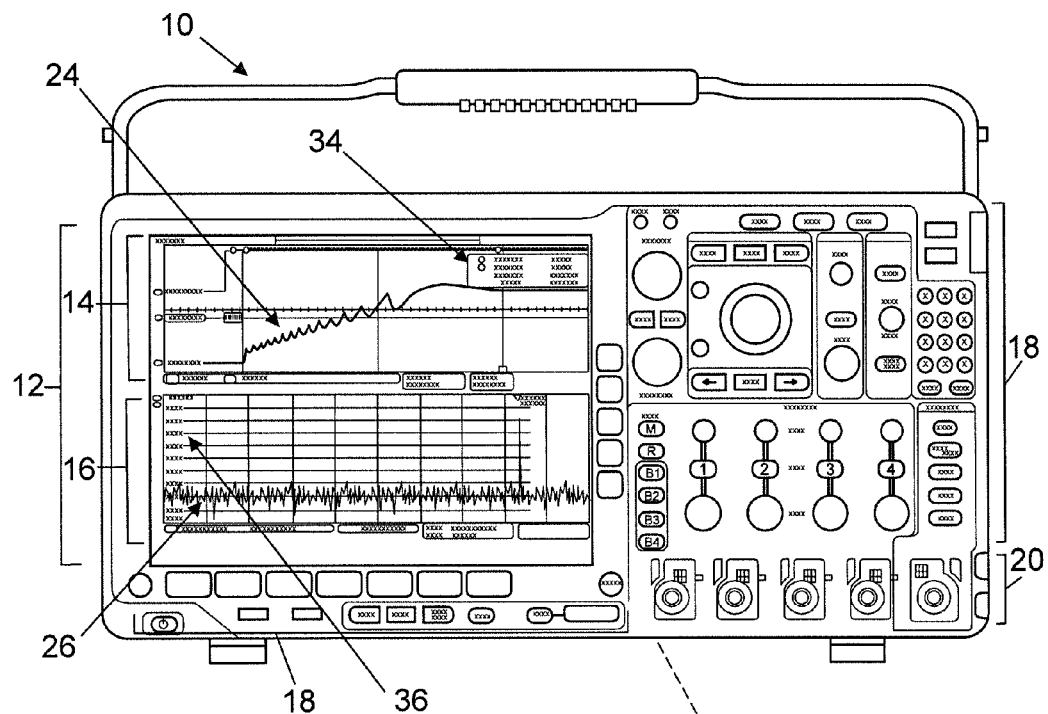
FIG. 1
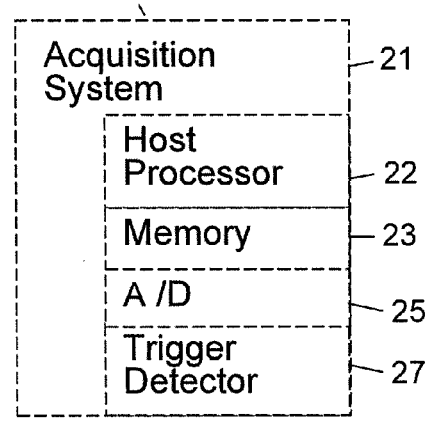

AUTOMATIC CENTER FREQUENCY AND SPAN SETTING IN A TEST AND MEASUREMENT INSTRUMENT

FIELD OF INVENTION

This invention relates to the field of test and measurement instruments and in particular test and measurement instruments configured to display frequency domain waveforms of input signals with automatic configuration of display center frequency and span settings.

BACKGROUND

Modern spectrum analyzers and digital oscilloscopes generally provide the capability to analyze the frequency domain content of a given input signal. Such test and measurement instruments are equipped with triggering hardware and software that is configurable to capture a desired event. Once the signal is captured, the resulting frequency domain analysis waveform is displayed with default display center frequency and span settings. The user must then manually adjust the display center frequency and span settings to highlight the areas of interest in the waveform. This can be a tedious and time consuming process. Accordingly, there exists a need to provide automatic display center frequency and span setting to simplify the operations of the test and measurement instrument.

SUMMARY OF THE INVENTION

A test and measurement instrument having initial display center frequency and span settings and configured to process an input signal is disclosed. The test and measurement instrument includes an analog to digital (A/D) converter 25 configured to digitize the input signal and a processor configured to perform a frequency domain transform on the digitized input signal to generate frequency domain data, locate a primary peak and determine a primary peak center frequency of the input signal. The processor is configured to adjust the initial display center frequency setting based on the primary peak center frequency. The processor is configured to perform a bandwidth comparison by comparing a bandwidth of the primary peak at a peak bandwidth test level to a peak bandwidth threshold. The processor is configured adjust the initial span setting based on the bandwidth comparison and generate a processed waveform signal using the adjusted display center frequency and span settings.

The processor may be configured to maintain a constant ratio between the span and resolution bandwidth (RBW), so that as the span is decreased the RBW is proportionally decreased. The processor may be configured to perform a frequency domain transform on the input signal to generate frequency domain data and locate the primary peak based on the frequency domain data. The processor may be configured to set the display center frequency to the primary peak center frequency. The processor may be configured to determine whether or not to adjust the span setting based on a minimum span.

The test and measurement may also include a display configured to display the processed waveform signal and a memory configured to store the digitized input signal. The processor may be configured to receive a user input and adjust the initial display center frequency and span settings. The processor may be configured to receive a user input and adjust the peak bandwidth threshold. The processor may be configured to adjust the span settings based on a span increment.

A method of processing an input signal in a test and measurement instrument having initial display center frequency and span settings is also disclosed. The method includes digitizing the input signal and locating a primary peak and determining a primary peak center frequency of the input signal. The initial display center frequency setting is adjusted based on the primary peak center frequency. A bandwidth comparison is performed by comparing a bandwidth of the primary peak at a peak bandwidth test level to a peak bandwidth threshold. The initial span setting is adjusted based on the bandwidth comparison. A processed waveform signal is generated using the adjusted display center frequency and span settings.

A constant ratio may be maintained between the span and resolution bandwidth (RBW), so that as the span is decreased the RBW is proportionately decreased. A frequency domain transform may be performed on the input signal to generate frequency domain data and the primary peak may be located based on the frequency domain data. The display center frequency may be set to the primary peak center frequency. Whether or not to adjust the span setting may be determined based on a minimum span.

A display may be provided and may be configured to display the processed waveform signal. The digitized input signal may be stored in a memory. A user input(s) may be received and the initial display center frequency and span settings may be adjusted based on the user input(s). A user input may be received and the peak bandwidth threshold may be adjusted based on the user input. The span settings may be adjusted based on a span increment.

A computer readable medium having stored thereon a computer program for execution by a processor configured to perform a method of processing an input signal in a test and measurement instrument having initial display center frequency and span settings is also disclosed. The method includes digitizing the input signal and locating a primary peak and determine a primary peak center frequency of the input signal. The initial display center frequency setting is adjusted based on the primary peak center frequency. A bandwidth comparison is performed by comparing a bandwidth of the primary peak at a peak bandwidth test level to a peak bandwidth threshold. The initial span setting is adjusted based on the bandwidth comparison. A processed waveform signal is generated using the adjusted display center frequency and span settings.

BRIEF DESCRIPTION OF THE FIGURES

FIG. 1 is a diagram of a mixed domain oscilloscope having a display;

DETAILED DESCRIPTION OF THE INVENTION

Figure 2:
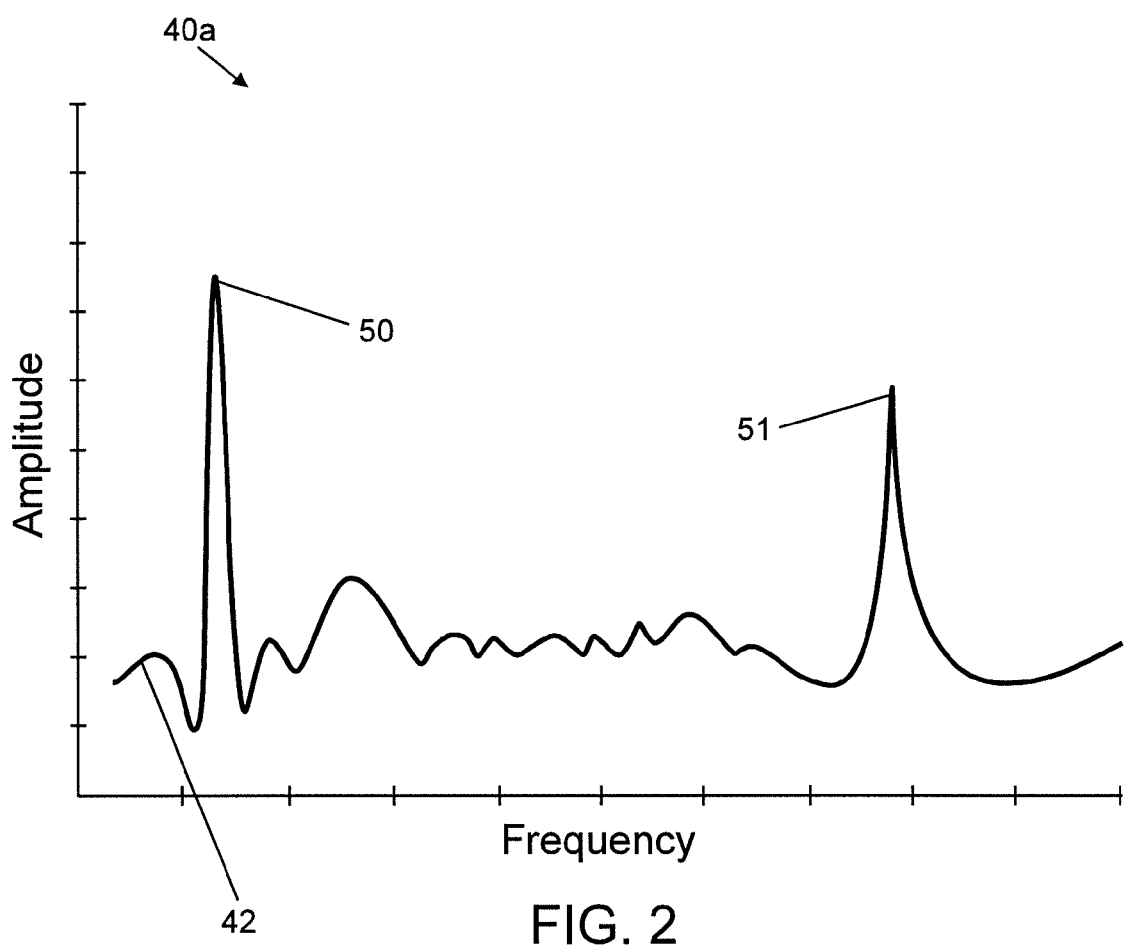
FIG. 2 is a diagram of display showing a waveform before automatic adjustment of center frequency and span.

Disclosed herein are techniques for analyzing a signal of interest and automatically adjusting the center frequency and span settings of a test and measurement instrument such as a spectrum analyzer or mixed-domain oscilloscope. During frequency domain analysis using a spectrum analyzer or mixed-domain oscilloscope, the user often needs to center the spectrum display on a particular signal of interest, then reduce the frequency span ("span") until the signal's on-screen waveform is wide enough to inspect and analyze. The process is typically manual and can be time consuming and tedious. The techniques disclosed herein provide an automated approach for setting the display center frequency and span in order to locate the most likely portion of a given waveform.

FIG. 1 is a diagram of a test and measurement instrument (oscilloscope) 10 having a display 12 that is divided into a plurality of display areas. The areas 14, 16 are configured to graphically display at least one waveform 24, 26 and other graphical indicia 34, 36 for example axes, graphical information and text. The oscilloscope 10 also has a plurality of user controls 18 configured for user input and a plurality of electrical inputs 20 configured to receive test signals and the like. In this example, user controls 18 include controls configured to select/adjust the display center frequency and span setting as is known to those skilled in the art.

In this example, the oscilloscope 10 is implemented as a stand-alone unit with an acquisition system 21 including a processor 22 having an associated memory 23 configured for storage of program information and data. It should be understood that processor 22 may be coupled to additional circuitry, e.g., I/O, graphics generation hardware and the like. The processor 22 is configured to receive at least a portion of the inputs via the user controls 18. Analog to digital (A/D) converter 25 is configured to digitize signals received on electrical inputs 20. Trigger detector (trigger system) 27 provides timing signals for controlling the acquisition process as discussed below. A variety of triggering modes is disclosed in U.S. Pat. No. 7,191,079 which is incorporated herein in its entirety. An automatic tuning process is disclosed in U.S. Pat. No. 4,611,164 which is also incorporated herein in its entirety.

The processor 22 is also configured to generate at least a portion of the information displayed on the display 12. It should be understood that the test and measurement instrument may be implemented using a variety of hardware and software including embodiments implemented using computing devices, e.g., desktop, laptop, tablet, smart phone or other computing devices, and that some of these systems may or may not provide or require a display device. A digitizer is an example of a test and measurement instrument without a display.

In general, the following approach may be used to automatically set the display center frequency and span:
1. Set the display center frequency to the middle of the band of the instrument or a subrange as selected by the user;
2. Set the span to the entire bandwidth of the instrument or a subrange as selected by the user;
3. Perform an acquisition and generate a frequency transform waveform of the signal;
4. Locate the highest-amplitude peak in the frequency-domain waveform ("primary peak"), and set the display center frequency equal to the center frequency of the primary peak;
5. Determine the bandwidth of the primary peak between points that are n dB below (e.g., 3 dB) the peak amplitude.
6. If the primary peak bandwidth is wider than w percent (e.g., 10%) of the current span, stop;
7. If the span is currently at the minimum possible value, stop;
8. Reduce the span to a smaller value (e.g., 10% of the current value). The instrument may also be configured to maintain a constant ratio between the span and resolution bandwidth (RBW), so that as the span is decreased, the RBW is decreased by the same proportion. This reveals more details of the signal; and
9. Repeat steps 3-8 until complete.

Figure 3:
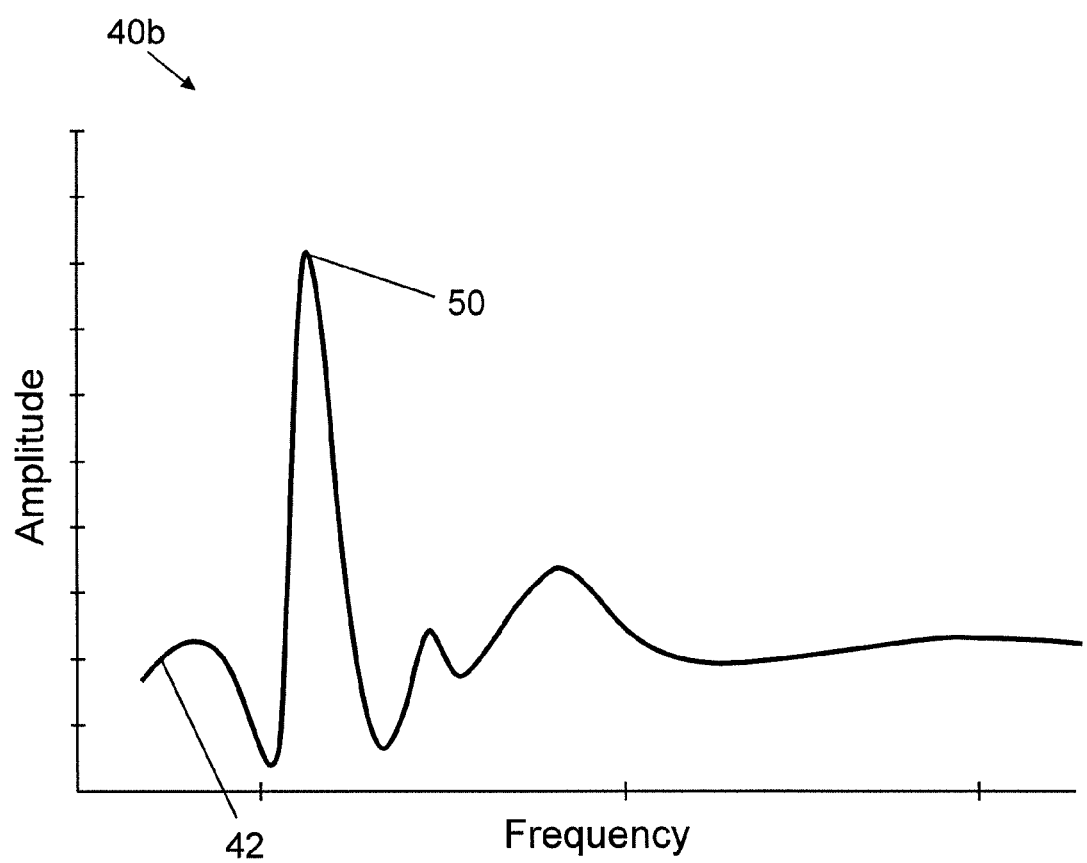
FIG. 3 is a diagram of a display showing the waveform in more detail.
Figure 4:
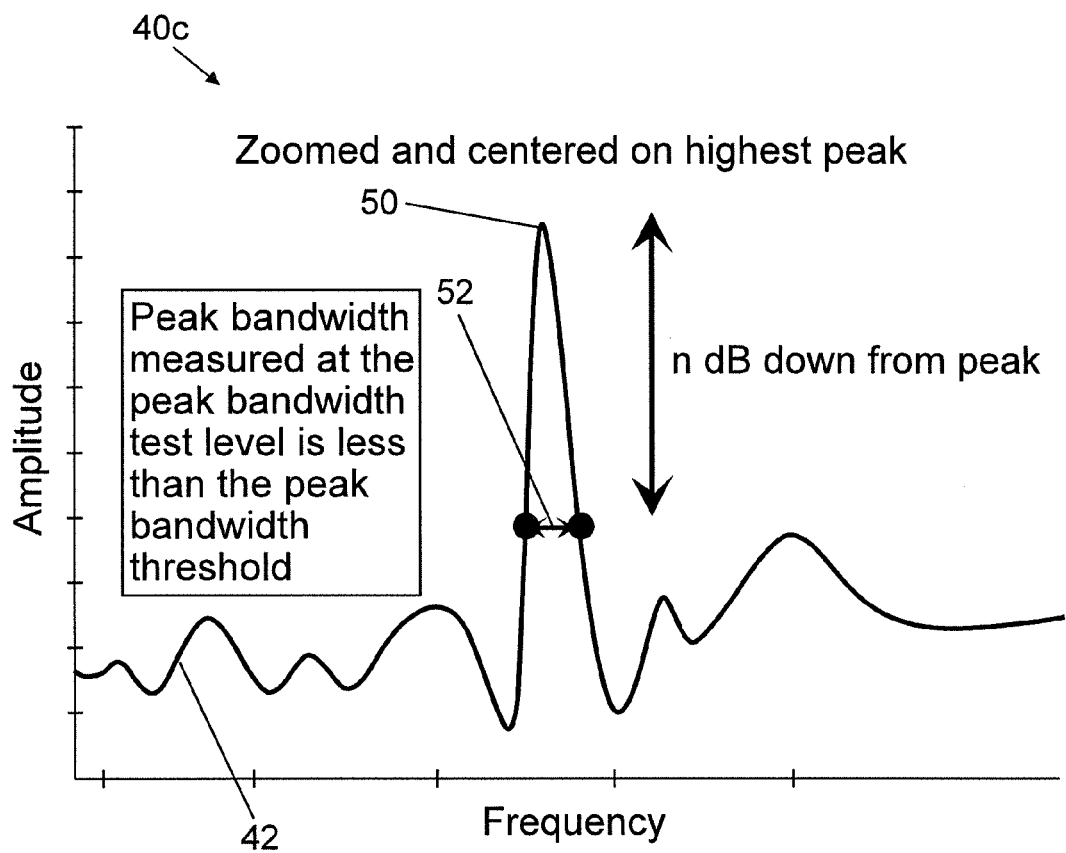
FIG. 4 is a diagram of a display after zooming in on the primary peak.

FIGS. 2-5 are diagrams of displays with waveforms displayed at different points in an automatic process as disclosed above. FIGS. 2-4 show the waveform in an intermediate stage of the process. It should be understood that only the final display (FIG. 5) need be generated by an actual test and measurement instrument. FIG. 2 is a diagram of display 40a showing a waveform 42 before automatic adjustment of center frequency and span. The waveform 42 includes a larger (primary) peak 50 and a smaller (secondary) peak 51. Prior to acquisition, the display center frequency may be adjusted to the middle of the band of the instrument and the span may be set to the entire bandwidth of the band.

FIG. 3 is a diagram of a display 40b showing the left portion of waveform 42 in more detail. Since the left portion of the band contains the primary peak 50, the processor 22 is configured to automatically adjust the center frequency and span to focus on this portion of the waveform. For example, the processor 22 is generally configured to generate a frequency transform of the acquired signal and store the frequency-domain representation of the signal in the memory 23. Based on the frequency domain-representation of the signal the processor is configured to locate the highest-amplitude peak in the frequency-domain waveform. The processor may then set the display center frequency equal to the waveform peak center frequency.

FIG. 4 is a diagram of a display 40c zoomed in on the primary peak 50 of waveform 42. As disclosed above, the display center frequency is set to the primary peak 50 center frequency. The span may be adjusted as follows. The processor may be configured to determine the width of the primary peak 50 at a test point that is located at a peak bandwidth test level 52. The peak bandwidth test level 52 may be specified in dB measured relative to the peak amplitude. The peak bandwidth test level may have a default value, e.g., 3 dB. It should be understood that the user may adjust the peak bandwidth test level as needed. If the peak bandwidth at the peak bandwidth test level is wider than a peak bandwidth threshold, the zoom level need not be adjusted (stop). The peak bandwidth threshold may be specified in terms of a percentage of the current span. It should be understood that the peak bandwidth threshold may have a default value, e.g., 10%.

If the span is currently at the minimum possible value for the test and measurement instrument, no further span adjustment is needed. If the peak bandwidth measured at the peak bandwidth test level is less than the peak bandwidth threshold, the current span settings may be reduced to a smaller value using a span adjustment increment, e.g., 10% of the current span setting. The test and measurement instrument may also be configured to maintain a constant ratio between the span and resolution bandwidth (RBW), so that as the span is decreased the RBW is decreased by the same proportion. This reveals more details of the signal. The process may be repeated with the adjusted span settings beginning with the acquisition process.

Figure 5:
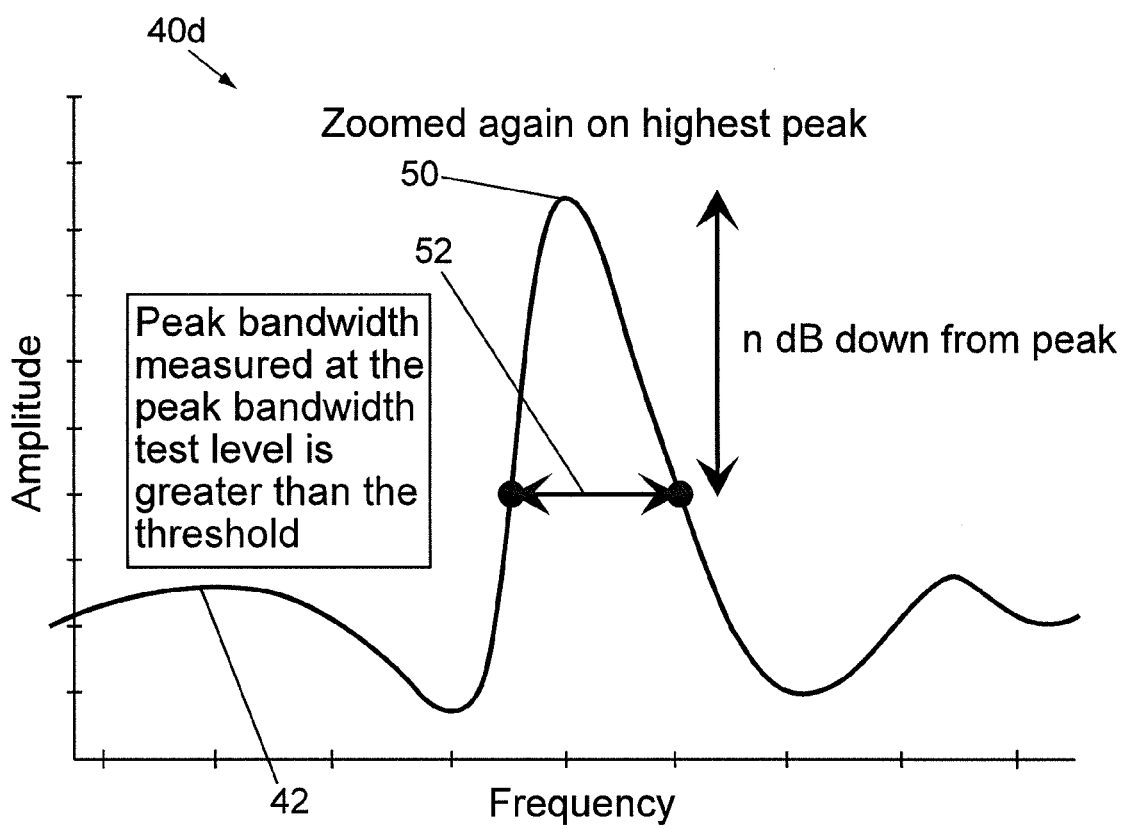
FIG. 5 is a diagram of a display zoomed in on the primary peak after span adjustment.

FIG. 5 is a diagram of a display 40d zoomed in on the primary peak 50 after final span adjustment. In this example, the peak bandwidth measured at the peak bandwidth test level is greater than the peak bandwidth threshold. Accordingly, no further span adjustment is needed.

Figure 6:
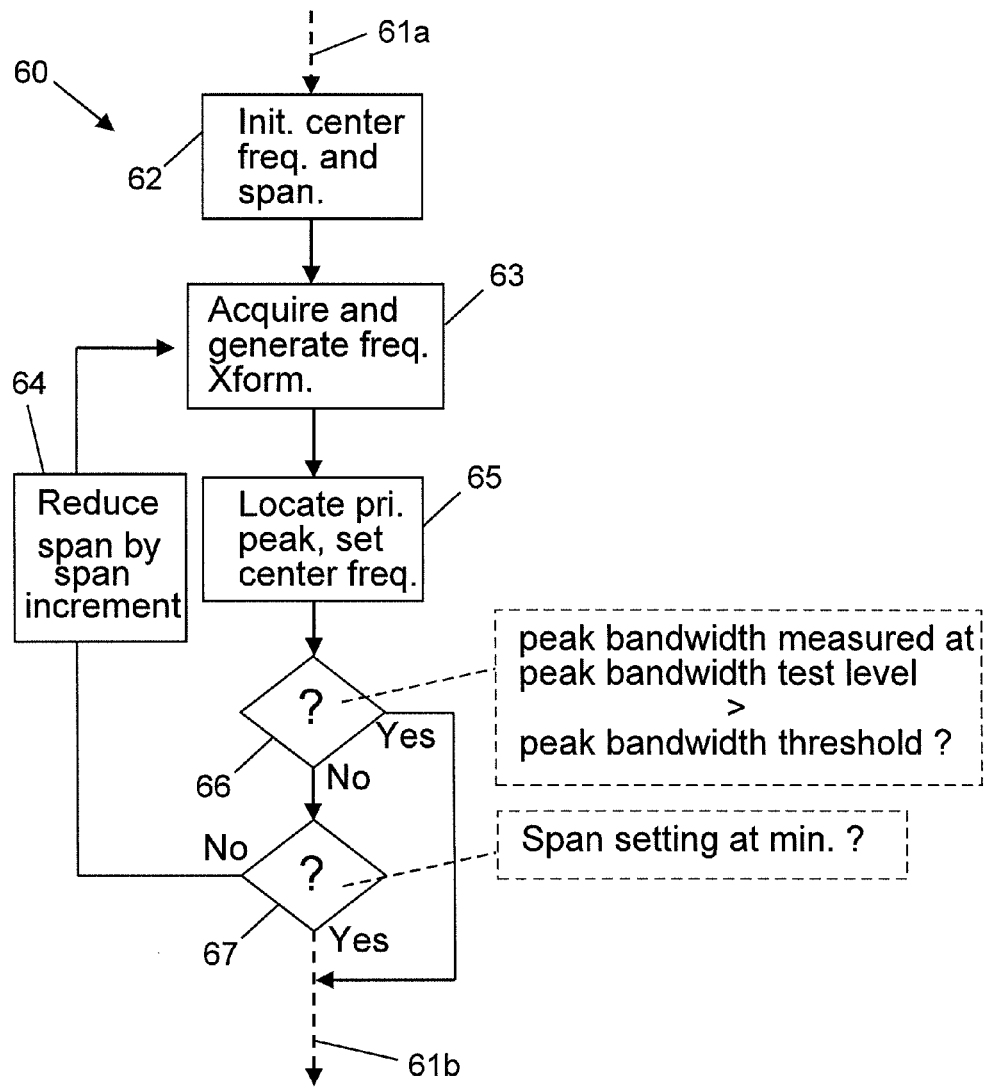
FIG. 6 is a flowchart showing automatic center frequency and span adjustment process.

FIG. 6 is a flowchart 60 showing the process disclosed above in general terms. It should be understood that any flowcharts contained herein are illustrative only and that other program entry and exit points, time out functions, error checking routines and the like (not shown) would normally be implemented in typical system software. It is also understood that system software may run continuously after being launched. Accordingly, any beginning and ending points, e.g., reference numbers 61a and 61b, are intended to indicate logical beginning and ending points of a portion of code that can be executed as needed. The order of execution of any of the blocks may also be varied without departing from the scope of this disclosure. Implementation of these aspects is readily apparent and well within the grasp of those skilled in the art based on the disclosure herein.

The initial display center frequency is set to the middle of the band of the instrument and the initial span is set to the entire bandwidth of the band as shown by block 62. Acquisition is performed and a frequency transform of the signal is generated and stored in memory as shown by block 63. The primary peak is located using the frequency-domain data and the display center frequency is set to the primary peak center frequency as shown by block 66. The width if the primary peak at the peak bandwidth test level is compared to the span test threshold. If the width at the peak bandwidth test level is greater than the span test threshold, the process is complete as shown by block 66. If not, the process continues at block 67. If the span setting is at a minimum value, the process is complete. If not, the span setting is reduced by the span increment as shown by block 64 and processing continues with block 63.

Figure 7:
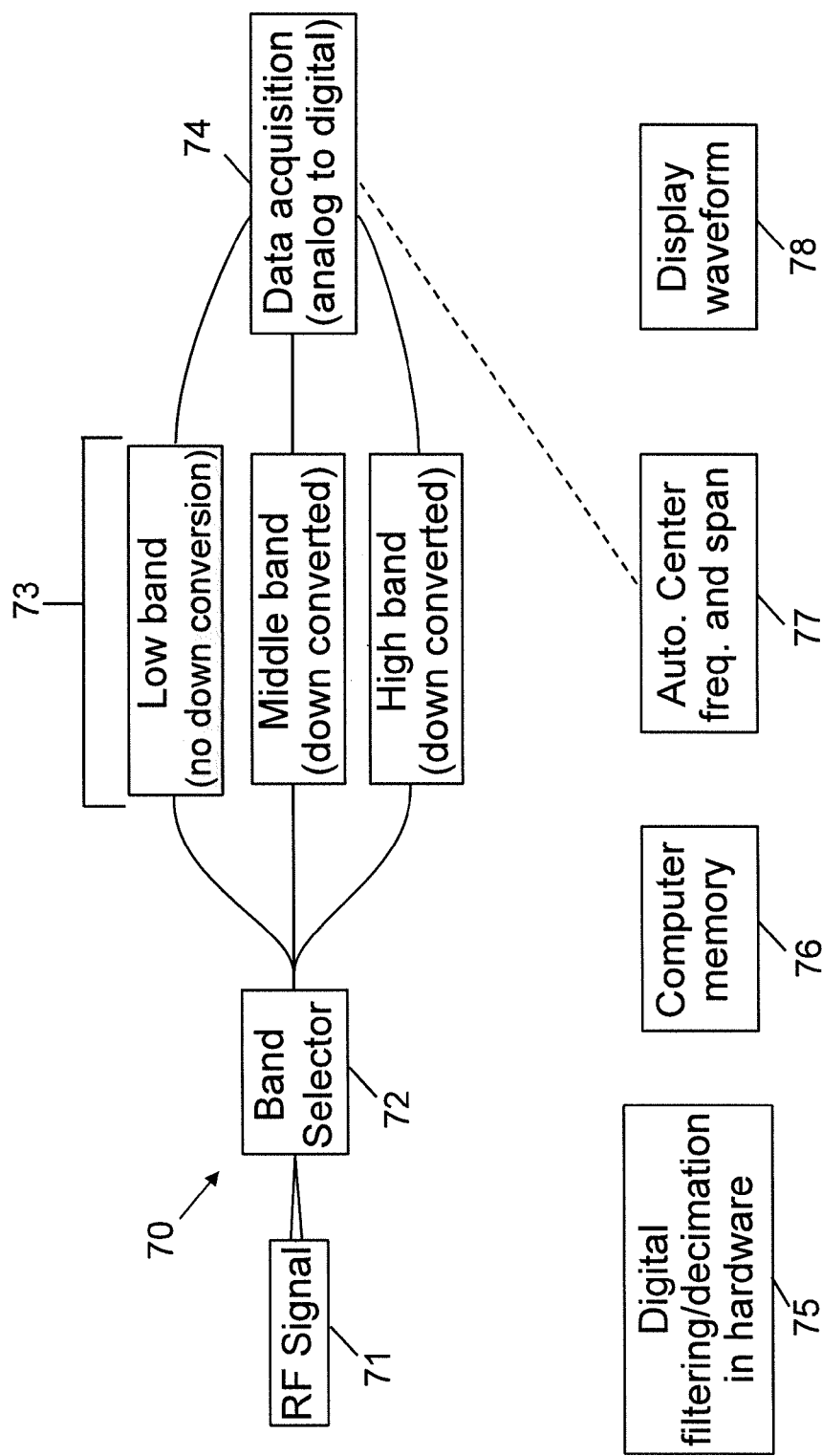
FIG. 7 is a block diagram showing acquisition, automatic center frequency and span adjustment and subsequent display of an input waveform.

FIG. 7 is a high level block diagram 70 showing acquisition, automatic center frequency and span adjustment and subsequent display of an input waveform. An RF signal is coupled to an input of the test and measurement instrument as shown by block 71. A given band is selected as shown by block 72. The band may be down converted as needed as shown by reference number 73. The RF signal is digitized as shown by block 74. The digital signal may be decimated and filtered as shown by block 75. The resulting data is stored in memory as shown by block 76. Automatic setting of center frequency and span may be performed as shown by block 77. The resulting waveform may be displayed as shown by block 78.

It should be understood that many variations are possible based on the disclosure herein. Although features and elements are described above in particular combinations, each feature or element can be used alone without the other features and elements or in various combinations with or without other features and elements. The apparatus or methods disclosed herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A test and measurement instrument having initial display center frequency and span settings and configured to process an input signal, the test and measurement instrument comprising:
    an analog to digital converter configured to digitize the input signal; and
    a processor configured to:
       perform a frequency domain transform on the digitized input signal to generate frequency domain data;
       locate a primary peak of the digitized input signal in the frequency domain data;
       determine a primary peak center frequency of the digitized input signal;
       adjust the initial display center frequency setting based on the primary peak center frequency in the frequency domain data;
       perform a bandwidth comparison by determining a peak bandwidth of the primary peak of the digitized input signal in the frequency domain data at a peak bandwidth test level and comparing the peak bandwidth to a peak bandwidth threshold, wherein the peak bandwidth test level is defined by user input; and
       adjust the initial span setting based on the bandwidth comparison and generate a processed waveform signal from the frequency domain data using the adjusted display center frequency and span settings.

2. The test and measurement of claim 1, wherein the processor is further configured to maintain a constant ratio between the span and resolution bandwidth (RBW), such that as the span is decreased the RBW is proportionately decreased.

3. The test and measurement of claim 1, wherein the processor is configured to adjust the initial display center frequency setting to the primary peak center frequency.

4. The test and measurement of claim 1, wherein the processor is configured to adjust the initial span setting based on a minimum span.

5. The test and measurement of claim 1, further comprising a display configured to display the processed waveform signal.

6. The test and measurement of claim 1, further comprising a memory configured to store the digitized input signal.

7. The test and measurement of claim 1, wherein the processor is configured to receive a user input and adjust the initial display center frequency and span settings based on the user input.

8. The test and measurement of claim 1, wherein the processor is configured to receive a user input and adjust the peak bandwidth threshold based on the user input.

9. The test and measurement of claim 1, wherein the processor is configured to adjust the initial span setting based on a span increment.

10. A method of processing an input signal in a test and measurement instrument having initial display center frequency and span settings, the method comprising:

digitizing the input signal and performing a frequency domain transform of the digitized input signal to generate frequency domain data;

locating a primary peak of the digitized input signal in the frequency domain data and determining a primary peak center frequency of the digitized input signal based on the frequency domain data, wherein the primary peak is the highest-amplitude peak;

adjusting the initial display center frequency setting based on the primary peak center frequency;

performing a bandwidth comparison by determining a peak bandwidth of the primary peak of the digitized input signal in the frequency domain data at a peak bandwidth test level and comparing the peak bandwidth to a peak bandwidth threshold, wherein the peak bandwidth threshold is defined as a percentage of the initial span setting;

adjusting the initial span setting based on the bandwidth comparison; and generating a processed waveform signal from the frequency domain data using the adjusted display center frequency and span settings.

11. The method of claim 10, further comprising maintaining a constant ratio between the span and resolution bandwidth (RBW), so that as the span is decreased the RBW is proportionately decreased.

12. The method of claim 10, further comprising setting the display center frequency to the primary peak center frequency.

13. The method of claim 10, wherein adjusting the initial span setting is based on a minimum span.

14. The method of claim 10, further comprising displaying the processed waveform signal.

15. The method of claim 10, further comprising storing the digitized input signal in a memory.

16. The method of claim 10, further comprising receiving a user input and adjusting the initial display center frequency and span settings based on the user input.

17. The method of claim 10, further comprising receiving a user input and adjusting the peak bandwidth threshold based on the user input.

18. The method of claim 10, further comprising adjusting the span setting based on a span increment.

19. A computer readable storage medium having stored thereon a computer program which, when executed by a processor, causes the processor to:

digitize an input signal;

perform a frequency domain transform of the digitized input signal to generate frequency domain data;

locate a primary peak of the digitized input signal in the frequency domain data;

determine a primary peak center frequency of the digitized input signal based on the frequency domain data, wherein the primary peak is the highest-amplitude peak;

adjust an initial display center frequency setting based on the primary peak center frequency;

perform a bandwidth comparison by determining a peak bandwidth of the primary peak of the digitized input signal in the frequency domain data at a peak bandwidth test level and comparing the peak bandwidth to a peak bandwidth threshold, wherein the peak bandwidth test level is defined by user input and the peak bandwidth threshold is a percentage of the initial span setting;

adjust an initial span setting based on the bandwidth comparison; and generate a processed waveform signal from the frequency domain data using the adjusted display center frequency and span settings.

* * * * *